(12) United States Patent
Jeon et al.

(10) Patent No.: US 6,909,143 B2
(45) Date of Patent: Jun. 21, 2005

(54) LATERAL DOUBLE-DIFFUSED MOS TRANSISTOR HAVING MULTIPLE CURRENT PATHS FOR HIGH BREAKDOWN VOLTAGE AND LOW ON-RESISTANCE

(75) Inventors: Chang-Ki Jeon, Kyonggi-Do (KR); Jong-Jib Kim, Seoul (KR); Young-Suk Choi, Bucheon (KR)

(73) Assignee: Fairchild Korea Semiconductor, Bucheon (KR)

( * ) Notice: Subject to any disclaimer, the term of this patent is extended or adjusted under 35 U.S.C. 154(b) by 0 days.

(21) Appl. No.: 10/818,330

(22) Filed: Apr. 2, 2004

(65) Prior Publication Data

US 2004/0201061 A1 Oct. 14, 2004

(30) Foreign Application Priority Data

Apr. 9, 2003 (KR) ................. 10-2003-0022210

(51) Int. Cl.[7] ............................................. H01L 29/76
(52) U.S. Cl. .................. 257/335; 257/336; 257/339; 257/343; 257/408; 257/409; 257/493
(58) Field of Search ................................. 257/104, 335, 257/336, 339, 343, 344, 408, 409, 481, 493

(56) References Cited

U.S. PATENT DOCUMENTS 5,386,136 A * 1/1995 Williams et al. ............ 257/409
6,168,983 B1 1/2001 Rumennik et al.

* cited by examiner

Primary Examiner—Andy Huynh
(74) Attorney, Agent, or Firm—Thomas R. FitzGerald Esq.

(57) ABSTRACT

A lateral double-diffused MOS (LDMOS) transistor is provided. The LDMOS transistor includes a semiconductor substrate 202 formed of a material having p-conductivity type impurities, a drift region formed of a material having n-conductivity type impurities on the semiconductor substrate, a first buried layer 206 of p-type material and a second buried layer 208 formed of n-type material. Layers 206 and 208 are arranged at the boundary between the semiconductor substrate and the drift region. A first well region 210 of p-type material contacts the first buried layer 206 n-type in a first portion 1 of the drift region. A first source region 214 conductivity in a predetermined upper region of the first well region, a drain region formed of a material having second conductivity type impurities in a predetermined region of the drift region, the drain region being spaced a predetermined gap apart from the first well region, a third buried layer formed of a material having first conductivity type impurities in a second region of the drift region, the third buried layer being overlapped with a part of an upper portion of the first buried layer, a second well region formed of a material having first conductivity type impurities in the second region of the drift region, the second well region being overlapped with the third buried layer, a second source region formed of a material having second conductivity type impurities in a predetermined upper region of the second well region, a gate insulating layer formed in a first channel region inside the first well region and in a second channel region inside the second well region, a gate electrode formed on the gate insulating layer, a source electrode formed to be electrically connected to the first source region and the second source region, and a drain electrode formed to be electrically connected to the drain region.

9 Claims, 13 Drawing Sheets

LATERAL DOUBLE-DIFFUSED MOS TRANSISTOR HAVING MULTIPLE CURRENT PATHS FOR HIGH BREAKDOWN VOLTAGE AND LOW ON-RESISTANCE

BACKGROUND OF THE INVENTION

This application claims the priority of Korean Patent Application No. 2003-22210, filed on Apr. 9, 2003, in the Korean Intellectual Property Office, the disclosure of which is incorporated herein in its entirety by reference.

1. Field of the Invention

The present invention relates to a lateral double-diffused MOS transistor, and more particularly, to a lateral double-diffused MOS transistor having multiple current paths for a high breakdown voltage and a low on-resistance.

2. Description of the Related Art

In general, high-voltage integrated circuits (ICs) in which at least one high-voltage transistor is arranged on the same chip together with low-voltage circuits are widely used in a variety of electrical applications. In these ICs, a lateral double-diffused MOS (LDMOS) transistor is an important high-voltage device. It is well-known to design LDMOS transistorsby, minimizing on-resistance while maintaining a high breakdown voltage. However, it is also well-known that low on-resistance and high breakdown voltage parameters are contradictory to each other in current process technologies.

A technology for increasing a breakdown voltage while maintaining a low on-resistance is reduced surface field (RESURF) technology. In addition, in order to obtain an increase in a breakdown voltage and a reduction in an on-resistance more efficiently, a structure having a field shaping layer isalso known. According to the RESURF technology, by reducing the thickness of an epitaxial layer and simultaneously increasing the doping concentration of the epitaxial layer slightly, a high breakdown voltage and a desired on-resistance can be obtained. By redistributing a field density inside a LDMOS transistor, a low on-resistance can be obtained in the field shaping layer. The more the field shaping, the lower the on-resistance of the LDMOS transistor.

FIG. 1 is a cross-sectional view illustrating a structure of a conventional LDMOS transistor in which a RESURF technology and a field shaping layer are introduced.

Referring to FIG. 1, an $n^-$-type epitaxial layer 104 is arranged on a $p^-$-type semiconductor substrate 102. The $n^-$-type epitaxial layer 104 is used as a drift region. A p-type buried layer 106 is arranged in a part of region of a boundary between the $p^-$-type semiconductor substrate 102 and the $n^-$-type epitaxial layer 104. A $p^-$-type well region 108 is formed in a predetermined upper region of the $n^-$-type epitaxial layer 104. A lower portion of the $p^-$-type well region 108 may be overlapped with a lower portion of the p-type buried layer 106. An $n^+$-type source region 110 and a $p^+$-type source contact region 112 are arranged in a predetermined upper region of the $p^-$-type well region 108. Meanwhile, an $n^+$-type drain region 114 is arranged in the predetermined upper region of the $n^-$-type epitaxial layer 104 to be spaced apart from the $p^-$-type well region 108 by a predetermined gap.

A p-type field shaping layer 116 is arranged between the $p^-$-type well region 108 and the $n^+$-type drain region 114. The p-type field shaping layer 116 is spaced a predetermined distancefrom the $p^-$-type well region 108 and the $n^+$-type drain region 114, respectively. A gate insulating layer 120 is arranged on a channel region 118, and a gate electrode 122 is arranged on the gate insulating layer 120. A source electrode 124 is formed to be electrically connected to the $n^+$-type source region 110 and the $p^+$-type source contact region 112. A drain electrode 126 is formed to be electrically connected to the $n^+$-type drain region 114. The gate electrode 122, the source electrode 124, and the drain electrode 126 are electrically insulated from one another by an interlevel dielectric (ILD) layer 128.

In such a LDMOS transistor, the p-type field shaping layer 116 distributes the field inside the LDMOS transistor uniformly together with the p-type buried layer 106, such that field concentration in a bended junction portion is alleviated, breakdown voltage is increased and the stability of a device is improved. However, due to a limited current path (indicated by arrow in FIG. 1) composed of the channel region 118 and a lower portion of the p-type field shaping layer 116, an overall current transport ability is lowered, and since the p-type field shaping layer 116 is placed in the surface of the $n^-$-type drift region 116, the static on-resistance is high.

SUMMARY OF THE INVENTION

The present invention provides a lateral double-diffused MOS transistor having multiple current paths to reduce on-resistance without a drop in breakdown voltage.

According to an aspect of the present invention, there is provided a lateral double-diffused MOS (LDMOS) transistor, the LDMOS transistor comprising a semiconductor substrate formed of a material having first conductivity type impurities, a drift region formed of a material having second conductivity type impurities on the semiconductor substrate, a first buried layer formed of a material having first conductivity type impurities and a second buried layer formed of a material having second conductivity type impurities, which are arranged at the boundary between the semiconductor substrate and the drift region, a first well region formed of a material having first conductivity type impurities to contact the first buried layer in a first portion of the drift region, a first source region formed of a material having second conductivity type impurities in a predetermined upper region of the first well region, a drain region formed of a material having second conductivity type impurities in a predetermined portion of the drift region, the drain region being spaced a predetermined distance from the first well region, a third buried layer formed of a material having first conductivity type impurities in a second portion of the drift region, the third buried layer being overlapped with a part of an upper portion of the first buried layer, a second well region formed of a material having first conductivity type impurities in the second region of the drift region, the second well region being overlapped with the third buried layer, a second source region formed of a material having second conductivity type impurities in a predetermined upper portion of the second well region, a gate insulating layer formed in a first channel region inside the first well region and in a second channel region inside the second well region, a gate electrode formed on the gate insulating layer, a source electrode formed to be electrically connected to the first source region and the second source region, and a drain electrode formed to be electrically connected to the drain region.

It is preferable that the impurity concentration of the first buried layer and the third buried layer is higher than the impurity concentration of the first well region and the second well region.

It is also preferable that the impurity concentration of the second buried layer is higher than the impurity concentration of the drift region.

It is also preferable that the first channel region is a region between the first source region and the drift region in an upper portion of the first well region, and the second channel region is in an upper portion of the second well, between the second source region and the drift region.

It is also preferable that carriers from the first source region move to the drain region through a first current path that comprises the drift region and the first channel region that is formed near a surface of the semiconductor substrate and a second buried layer.

It is also preferable that the first current path goes through the second channel region, the second source region, and the drift region between the first and second well regions and the drain region and the second current path comprises the second channel and the drift region between the second well and the drain region.

It is also preferable that the LDMOS transistor further includes a first source contact region, which is adjacent to the first source region in the first well region and is electrically connected to the source electrode, and a second source contact region, which is adjacent to the second source region in the second well region and is electrically connected to the source electrode.

It is also preferable that the first conductivity type impurities are p-type, and the second conductivity type impurities are n-type.

BRIEF DESCRIPTION OF THE DRAWINGS

The above and other aspects and advantages of the present invention will become more apparent by describing in detail a preferred embodiment thereof with reference to the attached drawings in which.

DETAILED DESCRIPTION OF THE INVENTION

Hereinafter, embodiments of the present invention will be described in detail with reference to the accompanying drawings. This invention may, however, be embodied in many different forms and should not be construed as being limited to the embodiments set forth herein.

Figure 2:
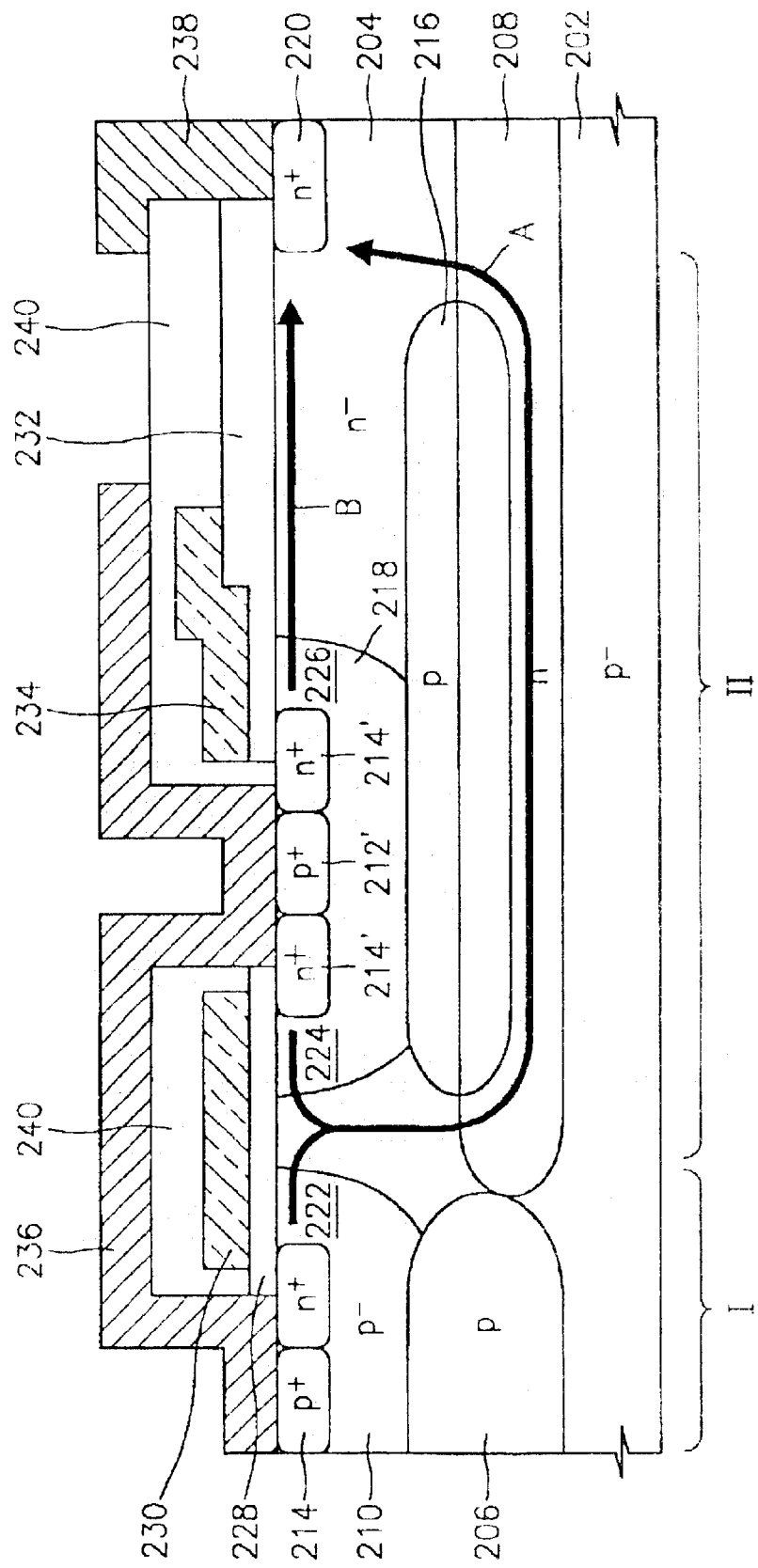
FIG. 2 is a cross-sectional view illustrating a structure of a lateral double-diffused MOS (LDMOS) transistor having double current paths according to an embodiment of the present invention.

FIG. 2 is a cross-sectional view illustrating a structure of a lateral double-diffused MOS (LDMOS) transistor having double current paths according to an embodiment of the present invention. Referring to FIG. 2, an $n^-$-type epitaxial layer 204 is arranged on a $p^-$-type semiconductor substrate 202. The $n^-$-type epitaxial layer 204 is used as a drift region. A first p-type buried layer 206 and a second n-type buried layer 208 are formed at the boundary between the $p^-$-type semiconductor substrate 202 and the $n^-$-type epitaxial layer 204, respectively. The first p-type buried layer 206 is arranged in a first portion I, and the second n-type buried layer 208 is arranged in a second portion II. A third p-type buried layer 216 is arranged on the second n-type buried layer 208. A lower portion of the third p-type buried layer 216 and an upper portion of the second n-type buried layer 208 are overlapped with each other.

A first $p^-$-type well region 210 is formed in an $n^-$-type epitaxial layer 204 of the first portion I, that is, a portion of layer 216 that is spaced a predetermined distance from a drain region 220. A lower surface of the first $p^-$-type well region 210 is overlapped with an upper surface of the first p-type buried layer 206. The first p-type buried layer 206 serves as a field shaping layer, and to this end, the impurity concentration of the first p-type buried layer 206 is higher than the impurity concentration of the first $p^-$-type well region 210. A first $n^+$-type source region 214 is formed in a predetermined upper region of the first $p^-$-type well region 210. A first $p^+$-type source contact region 212 is formed to be adjacent to the first $n^+$-type source region 214 in the first $p^-$-type well region 210. A first channel region 222 is arranged on the surface of the first $p^-$-type well region 210, that is, between the first $n^+$-type source region 214 and the $n^-$-type epitaxial layer 204.

A second $p^-$-type well region 218 is formed in the $n^-$-type epitaxial layer 204 on the third p-type buried layer 216 of the $n^-$-type epitaxial layer 204 of the second portion II, that is, a portion of layer 216 that is between the first portion I and the drain region 220. A lower surface of the second $p^-$-type well region 218 is overlapped with an upper surface of the third p-type buried layer 216 so that current movement between the second $p^-$-type well region 218 and the third p-type buried layer 216 is suppressed. A second $n^+$-type source region 214' is formed in a predetermined upper region of the second $p^-$-type well region 218. A second $p^+$-type source contact region 212' is formed to be adjacent to the second $n^+$-type source region 214' in the second $p^-$-type well region 218. According to a cross-section structure shown in FIG. 2, the second $n^+$-type source regions 214' on both sides of the second $p^+$-type source contact region 212' are separated from one another by the second $p^+$-type source contact region 212'. However, in actuality, the second n⁺-type source regions 214' are connected to one another while surrounding the second p⁺-type source contact region 212'. Second channel regions 224 and 226 are arranged on the surface of the second p⁻-type well region 218, that is, between the second n⁺-type source region 214' and the n⁻-type epitaxial layer 204.

Gate insulating layers 228 and 232 and gate electrodes 230 and 234 on the gate insulating layers 228 and 232 are formed on the first channel region 222 and the second channel regions 224 and 226. In particular, the gate insulating layer 228 is formed on the first channel region 222 and the second channel region 224, and the gate insulating layer 232 is formed on the second channel region 226. The gate electrode 230 is formed on the gate insulating layer 228, and the gate electrode 234 is formed on the gate insulating layer 232. According to a cross-section structure shown in FIG. 2, the gate electrodes 230 and 234 are separated from one another. However, in actuality, the gate electrodes 230 and 234 are electrically connected to one another. Thus, the same gate input voltage is applied to the gate electrodes 230 and 234. A source electrode 236 is formed to be electrically connected to the first p⁺-type source contact region 212 and the first n⁺-type source region 214. The source electrode 236 is also electrically connected to the second p⁺-type source contact region 212' and the second n⁺-type source region 214'. The source electrode 236 extends to a predetermined length so as to be overlapped with upper portions of the gate electrodes 230 and 234. A portion that extends in an edge region of a device serves as a field plate. A drain electrode 238 is formed to be electrically connected to the drain region 220. An interlevel dielectric (ILD) layer 240 electrically separates the gate electrodes 230 and 234, the source electrode 236, and the drain electrode 238 from one another, respectively.

In an LDMOS transistor having the above structure, if a bias voltage having a predetermined size is applied to the gate electrodes 230 and 234, an inversion layer is formed on the first channel region 222 on the first p⁻-type well region 210, and similarly, an inversion layer is also formed in the second channel regions 224 and 226 on the second p⁻-type well region 218. Thus, electrons which are a plurality of carriers from the first n⁺-type source region 214, flow into the n⁻-type epitaxial layer 204 through the first channel region 222. Similarly, electrons from the second n⁺-type source region 214' flow into the n⁻-type epitaxial layer 204 through the second channel regions 224 and 226. The electrons that flow into the n⁻-type epitaxial layer 204 through the first channel region 222 and the second channel region 224 do not move in a horizontal direction inside the n⁻-type epitaxial layer 204. This is because there is no current path in the horizontal direction from inside the n⁻-type epitaxial layer 204 due to the first p-type buried layer 206 and the third p-type buried layer 216. Thus, the electrons move in the horizontal direction along the second n-type buried layer 208. The electrons that move in the horizontal direction along the second n-type buried layer 208 flow into the drain region 220 across the n⁻-type epitaxial layer 204. Meanwhile, the electrons that flow into the n⁻-type epitaxial layer 204 through the second channel region 226 move in the horizontal direction along the surface of the n⁻-type epitaxial layer 204 and flow into the drain region 220.

Consequently, the LDMOS transistor according to the present invention has two sections of current paths, such as a first current path (indicated by arrow "A") and a second current path (indicated by arrow "B"). The first current path A is a path into which electrons flow through the first channel region 222 and the second channel region 224 and move along the second n-type buried layer 208. The second current path B is a path into which electrons flow through the second channel region 226 and move along the n⁻-type epitaxial layer 204. The two sections of current paths are provided such that a current transport ability is increased. An increase in the amount of current means that resistance is reduced by the increase. Thus, in a case of the LDMOS transistor according to the present invention, a current transport ability is increased such that an on-resistance of a device is reduced. Even though the on-resistance of the device is reduced, a breakdown voltage is not reduced together. This is because due to field shaping layers, such as the first p-type buried layer 206 and the third p-type buried layer 216 connected to the first p⁻-type well region 210 and the second p⁻-type well region 218, respectively, a breakdown voltage having a predetermined size can be maintained.

The case where the LDMOS transistor has the two sections of current paths has been described. However, by employing the present invention, at least three sections of current paths are provided such that a current transport ability can be further increased. As an example thereof, FIG. 3 illustrates a case where three current paths are provided.

Figure 3:
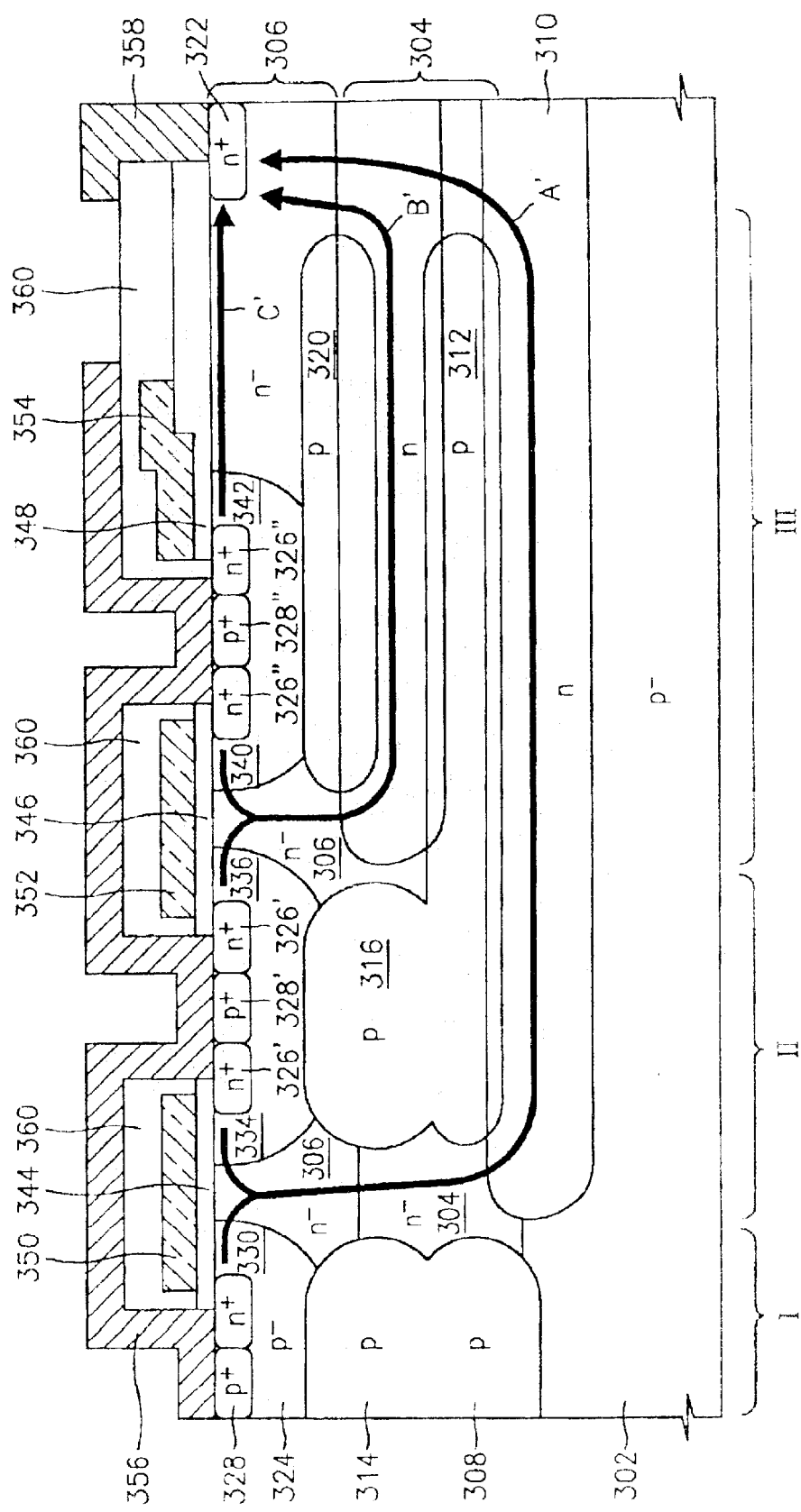
FIG. 3 is a cross-sectional view illustrating a structure of a lateral double-diffused MOS (LDMOS) transistor having multiple current paths according to another embodiment of the present invention.

Referring to FIG. 3, a first n⁻-type epitaxial layer 304 and a second n⁻-type epitaxial layer 306 are sequentially arranged on a p⁻-type semiconductor substrate 302.

The first n⁻-type epitaxial layer 304 and the second n⁻-type epitaxial layer 306 are used as a drift region. A first p-type buried layer 308 and a second n-type buried layer 310 are formed at the boundary between the p⁻-type semiconductor substrate 302 and the first n⁻-type epitaxial layer 304, respectively. The first p-type buried layer 308 is arranged in a first portion I, and the second n-type buried layer 310 is arranged in a second portion II. A third p-type buried layer 312 is arranged on the second n-type buried layer 310. A lower portion of the third p-type buried layer 312 and an upper portion of the second n-type buried layer 310 are overlapped with each other.

A fourth p-type buried layer 314, a fifth p-type buried layer 316, and a sixth n-type buried layer 318 are formed at the boundary between the first n⁻-type epitaxial layer 304 and a second n⁻-type epitaxial layer 306, respectively. The fourth p-type buried layer 314 is arranged in the first portion I. A lower portion of the fourth p-type buried layer 314 and an upper portion of the first p-type buried layer 308 are overlapped with each other. The fifth p-type buried layer 316 is arranged in the second portion II. A lower portion of the fifth p-type buried layer 316 and an upper portion of the third p-type buried layer 312 are overlapped with each other. The sixth n-type buried layer 318 is arranged in a third portion III. A lower portion of the sixth n-type buried layer 318 and an upper portion of the third p-type buried layer 312 are overlapped with each other. A seventh p-type buried layer 320 is formed on the sixth n-type buried layer 318. A lower portion of the seventh p-type buried layer 320 and an upper portion of the sixth n-type buried layer 318 are overlapped with each other. Meanwhile, an n⁺-type drain region 322 is arranged in a predetermined upper region of the second n⁻-type epitaxial layer 306.

A first p⁻-type well region 324 is formed in the second n⁻-type epitaxial layer 306 of the first portion I, that is, a region spaced a predetermined distance from the n⁺-type drain region 322. A lower surface of the first p⁻-type well region 324 is overlapped with an upper surface of the fourth p-type buried layer 314. The first p-type buried layer 302 and the fourth p-type buried layer 314 serve as a field shaping layer, and to this end, the impurity concentration of the first p-type buried layer 302 and the fourth p-type buried layer 314 is higher than the impurity concentration of the first p⁻-type well region 324. A first n⁺-type source region 326 is formed in a predetermined upper region of the first p⁻-type well region 324. A first p⁺-type source contact region 328 is formed to be adjacent to the first n⁺-type source region 326 in the first p⁻-type well region 324. A first channel region 330 is arranged on the surface of the first p⁻-type well region 324, that is, between the first n⁺-type source region 326 and the second n⁻-type epitaxial layer 306.

A second p⁻-type well region 332 is formed in the second n⁻-type epitaxial layer 306 on the fifth p-type buried layer 316 of the second region II, that is, a region between the first region I and the n⁺-type drain region 322. A lower surface of the second p⁻-type well region 332 is overlapped with an upper surface of the fifth p-type buried layer 316 so that current movement between the second p⁻-type well region 332 and the fifth p-type buried layer 316 is suppressed. A second n⁺-type source region 326' is formed in a predetermined upper region of the second p⁻-type well region 332. A second p⁺-type source contact region 328' is formed to be adjacent to the second n⁺-type source region 326' in the second p⁻-type well region 328. According to a cross-section structure shown in FIG. 3, the second n⁺-type source regions 326' on both sides of the second p⁺-type source contact region 328' are separated from one another by the second p⁺-type source contact region 328'. However, in actuality, the second n⁺-type source regions 326' are connected to one another while surrounding the second p⁺-type source contact region 328'. Second channel regions 334 and 336 are arranged on the surface of the second p⁻-type well region 332, that is, between the second n⁺-type source region 326' and the second n⁻-type epitaxial layer 306.

A third p⁻-type well region 338 is formed in the second n⁻-type epitaxial layer 306 on the seventh p-type buried layer 320 of a third region III, that is, a region between the second region II and the n⁺-type drain region 322. A lower surface of the third p⁻-type well region 338 is overlapped with an upper surface of the seventh p-type buried layer 320 so that current movement between the third p⁻-type well region 338 and the seventh p-type buried layer 320 is suppressed. A third n⁺-type source region 326" is formed in a predetermined upper region of the third p⁻-type well region 338. A third p⁺-type source contact region 328" is formed to be adjacent to the third n⁺-type source region 326" in the third p⁻-type well region 338. According to a cross-section structure shown in FIG. 3, the second n⁺-type source regions 326" on both sides of the third p⁺-type source contact region 328" are separated from one another by the third p⁺-type source contact region 328". However, in actuality, the third n⁺-type source regions 326" are connected to one another while surrounding the third p⁺-type source contact region 328". Third channel regions 340 and 342 are arranged on the surface of the third p⁻-type well region 338, that is, between the third n⁺-type source region 326" and the second n⁻-type epitaxial layer 306.

Gate insulating layers 344, 346, and 348 and gate electrodes 350, 352, and 354 on the gate insulating layers 344, 346, and 348 are formed on the first channel region 330, the second channel regions 334 and 336, and the third channel regions 340 and 342. The gate insulating layer 344 and the gate electrode 350 are formed on the first channel region 330 and the second channel region 334. The gate insulating layer 346 and the gate electrode 352 are formed on the second channel region 336 and the third channel region 340. The gate insulating layer 348 and the gate electrode 354 are formed on the third channel region 342. According to a cross-section structure shown in FIG. 3, the gate electrodes 350, 352, and 354 are separated from one another. However, in actuality, the gate electrodes 350, 352, and 354 are electrically connected to one another. Thus, the same gate input voltage is applied to the gate electrodes 350, 352, and 354.

A source electrode 356 is formed to be electrically connected to the first n⁺-type source region 326 and the first p⁺-type source contact region 328. The source electrode 356 is also electrically connected to the second n⁺-type source region 326' and the second p⁺-type source contact region 328'. In addition, the source electrode 356 is also electrically connected to the third n⁺-type source region 326" and the third p⁺-type source contact region 328". In particular, the source electrode 356 extends to a predetermined length so as to be overlapped with upper portions of the gate electrodes 350, 352, and 354. A portion that extends in an edge region of a device serves as a field plate. A drain electrode 358 is formed to be electrically connected to the n⁺-type drain region 322. An interlevel dielectric (ILD) layer 260 electrically separates the gate electrodes 350, 352, and 354, the source electrode 356, and the drain electrode 358 from one another, respectively.

The operation of an LDMOS transistor having the above structure is the same as the operation of the LDMOS transistor having the two sections of current paths described with reference to FIG. 2. Only, the LDMOS transistor further includes an inversion layer formed in the third channel regions 340 and 342 on the third p⁻-type well region 338 as a bias voltage having a predetermined size is applied to the gate electrodes 350, 352, and 354. As such, electrons that flow into the second n⁻-type epitaxial layer 306 from the first n⁺-type source region 326 through the first channel region 330 move to the n⁺-type drain region 322 along the first current path (indicated by arrow "A'") composed of the first n⁻-type epitaxial layer 304 and the second n-type buried layer 310, together with the electrons that flow into the second n⁻-type epitaxial layer 306 from the second n⁺-type source region 326' through the second channel region 334. Electrons that flow into the second n⁻-type epitaxial layer 306 from the second n⁺-type source region 326' through the second channel region 336 move to the n⁺-type drain region 322 along the second current path (indicated by arrow "B'") composed of the sixth n-type buried layer 318, together with the electrons that flow into the second n⁻-type epitaxial layer 306 from the third n⁺-type source region 326" through the third channel region 334. In addition, electrons that flow into the second n⁻-type epitaxial layer 306 through the third channel region 342 move in the horizontal direction along the third current path (indicated by arrow "C'") formed along the surface of the second n⁻-type epitaxial layer 306 and flow into the n⁺-type drain region. Consequently, the LDMOS transistor according to the present invention has three sections of current paths, such as the first current path A', the second current path B', and the third current path C'.

The case where the LDMOS transistor has the two sections of current paths has been described with reference to FIG. 2, and the case where the LDMOS transistor has the three sections of current paths has been described with reference to FIG. 3. As can be easily seen from the descriptions, four or more current paths can be easily formed by employing the same principle. In other words, the four or more current paths can be easily formed by adding an epitaxial layer and a well region by the number of current paths to be added and properly intercepting current movement to well regions using buried layers.

Hereinafter, several characteristics of a conventional LDMOS transistor and an LDMOS transistor according to the present invention will be compared with each other with reference to various simulation results.

Figure 1:
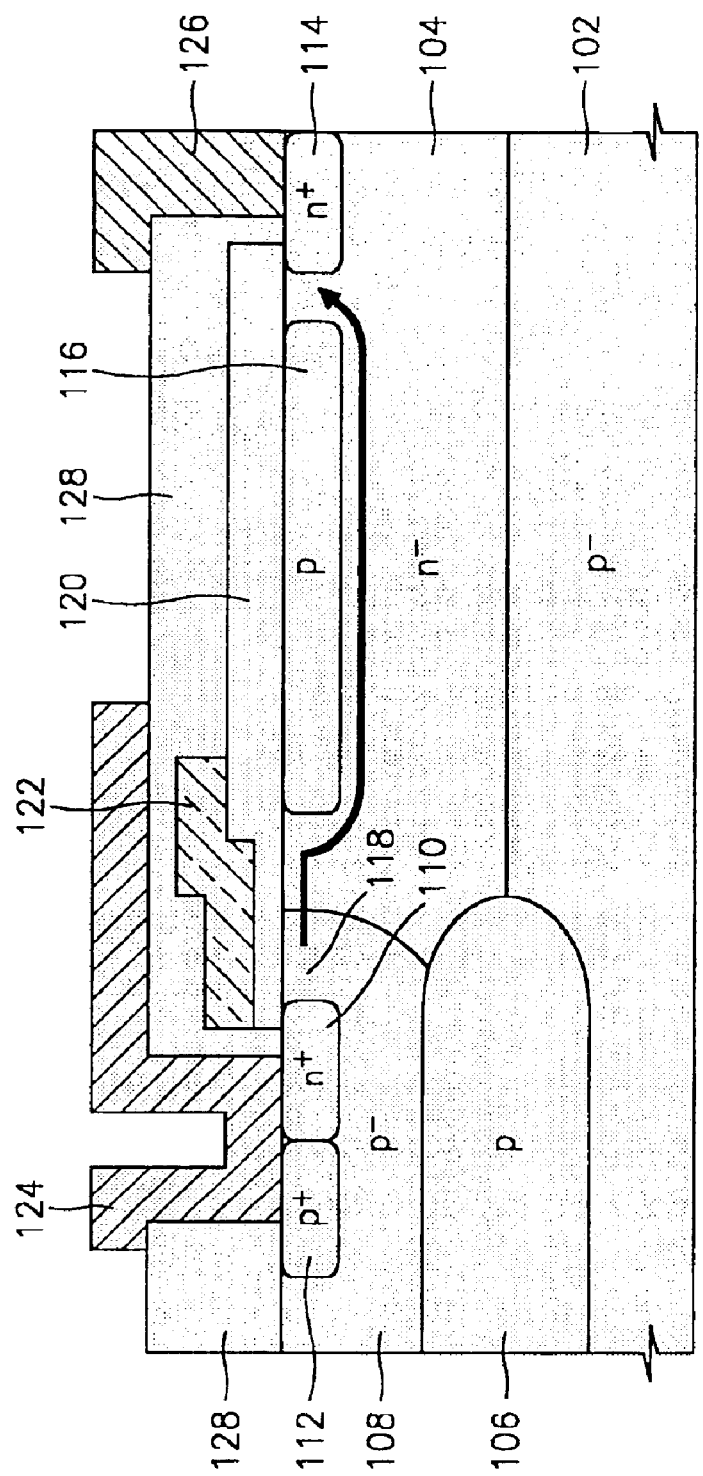
FIG. 1 is a cross-sectional view illustrating a structure of a conventional a lateral double-diffused MOS (LDMOS) transistor.
Figure 4:
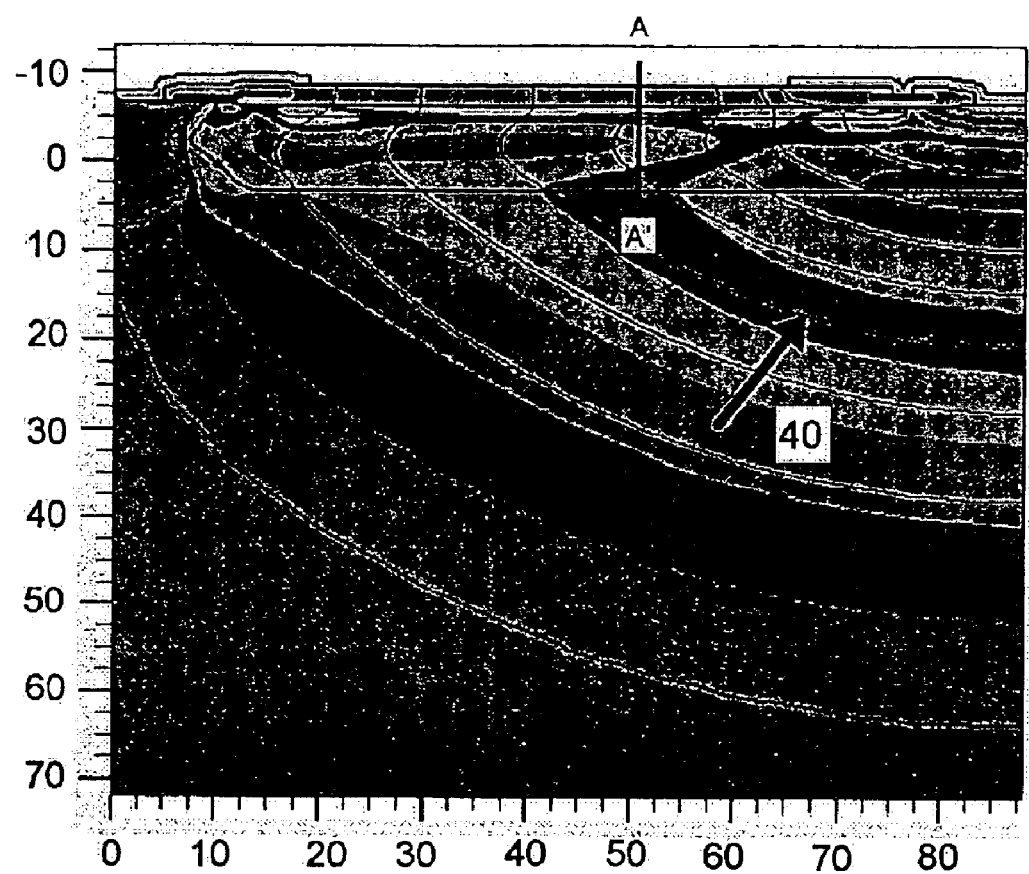
FIG. 4 illustrates the potential and field distribution of the lateral double-diffused MOS (LDMOS) transistor of FIG. 1.
Figure 5:
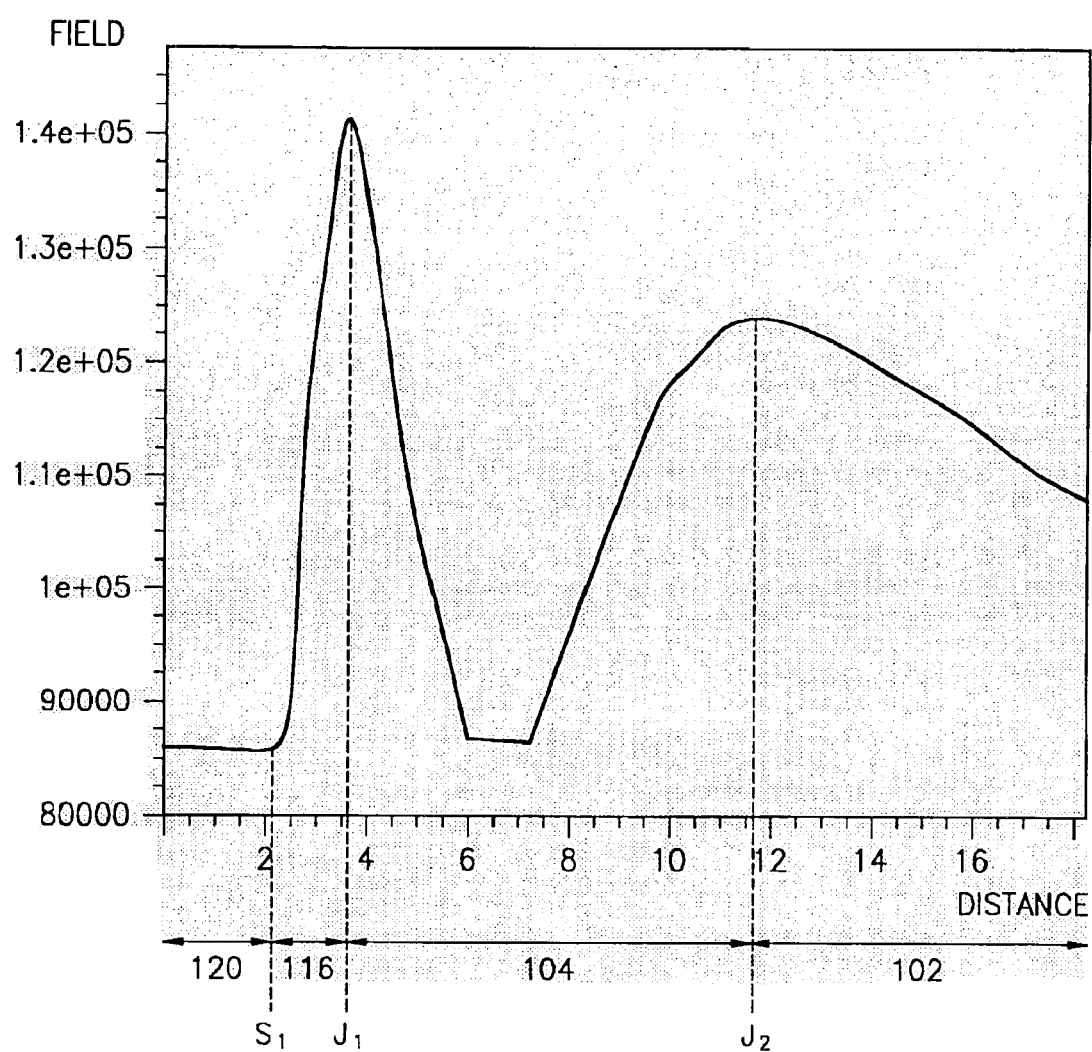
FIG. 5 is a graph of field strength versus distance from the surface of the LDMOS transistor to a vertical position along line A–A' of FIG. 4.

FIG. 4 illustrates the potential and field distribution of the LDMOS transistor of FIG. 1, and FIG. 5 is a graph of field strength versus distance from the surface of the LDMOS transistor to a vertical position along line A–A' of FIG. 4. In FIG. 4, potential distribution is indicated by line, and field distribution is indicated by brightness.

First, as shown in FIG. 4, the potential of the conventional LDMOS transistor is distributed in a gentle curved line shape. As indicated by arrow 40 in FIG. 4, the field is more strongly applied when being close to a drain and a surface and more weakly applied when being close to a direction opposite to the direction of the drain and a bottom. Next, as shown in FIG. 5, in a case of field distribution, a peak field appears twice while going from a surface S1 to the semiconductor substrate 102. Specifically, a first peak field appears in a junction J1 between the p-type field shaping layer 116 and the n$^-$-type epitaxial layer 104, and a second peak field appears in a junction J2 between the n$^-$-type epitaxial layer 104 and the semiconductor substrate 102. For reference, the size of the area underneath the field distribution curve indicates the size of a field of a device.

Figure 6:
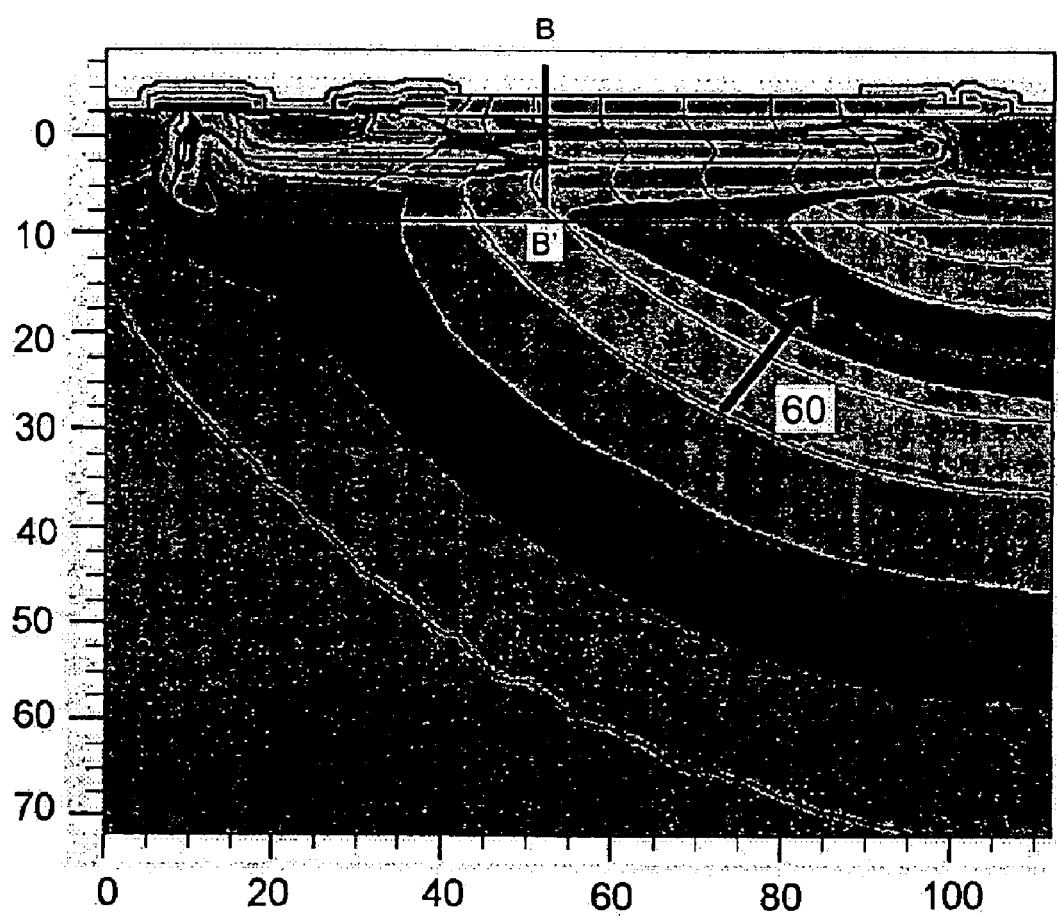
FIG. 6 illustrates potential and field distribution of the LDMOS transistor of FIG. 2.
Figure 7:
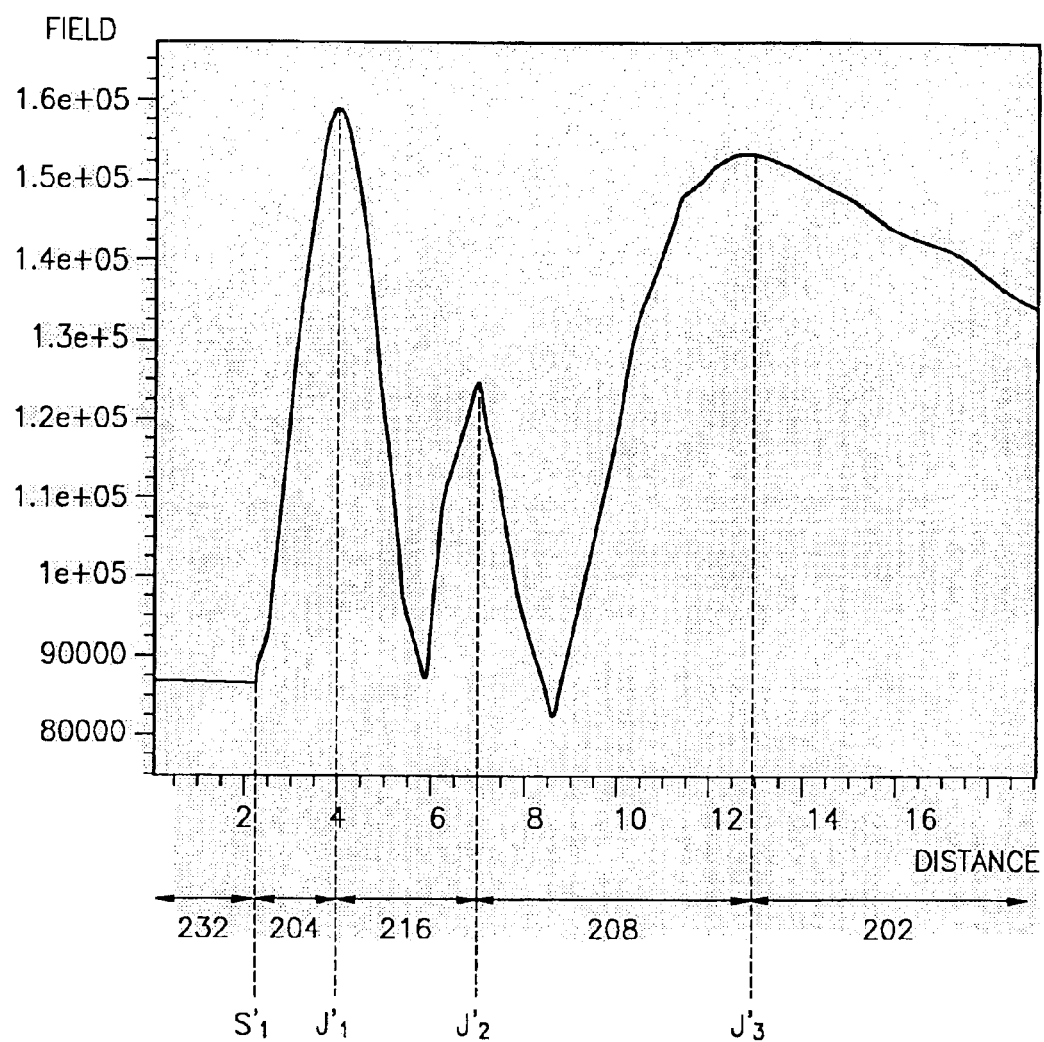
FIG. 7 is a graph of field strength versus distance from the surface of the LDMOS transistor to a vertical position along line B-B' of FIG. 6.

FIG. 6 illustrates potential and field distribution of the LDMOS transistor of FIG. 2, and FIG. 7 is a graph of field strength versus distance from the surface of the LDMOS transistor to a vertical position along line B–B' of FIG. 6. In FIG. 6, potential distribution is indicated by line, and field distribution is indicated by brightness.

First, as shown in FIG. 6, the potential of the LDMOS transistor according to an embodiment of the present invention is distributed in a gentle curved line shape, similar to the case of the conventional LDMOS transistor. As indicated by arrow 60 in FIG. 6, the field is more strongly applied when being close to a drain and a surface and more weakly applied when being close to a direction opposite to the direction of the drain and a bottom. Consequently, the field distribution of the LDMOS transistor according to the present invention is similar to the field distribution of the conventional LDMOS transistor. Next, as shown in FIG. 7, field distribution is similar to the field distribution of the conventional LDMOS transistor, as described previously. There is only a difference in that in the case of the conventional LDMOS transistor, a peak field appears twice while going from the surface S1 to the semiconductor substrate 102, whereas in the case of the LDMOS transistor according to the present invention, a peak field appears three times while going from a surface S1' to a semiconductor substrate 202. Specifically, a first peak field appears in a junction J1' between the n$^-$-type epitaxial layer 204 and the third p-type buried layer 216, and a second peak field appears in a junction J2' between the thee third p-type buried layer 216 and the second p-type buried layer 208, and a third peak field appears in a junction J3' between the second p-type buried layer 208 and the semiconductor substrate 202. As described above, the size of the area surrounded by the field distribution curve indicates the size of a field of a device. Thus, in the case of the LDMOS transistor according to the present invention, a peak field value is similar to the peak field value of the conventional LDMOS transistor, but the area surrounded by the field distribution curve is larger than the area of the conventional LDMOS transistor. This means that the size of the field of the device of the LDMOS transistor according to the present invention is larger than the size of the field of the device of the conventional LDMOS transistor and consequently, the impurity doping concentration of the n$^-$-type epitaxial layer 204 may be further increased. It can be easily predicted that if the impurity doping concentration of the n$^-$-type epitaxial layer 204 is increased, a current transport ability of the device is increased and an on-resistance of the device is reduced.

Figure 8:
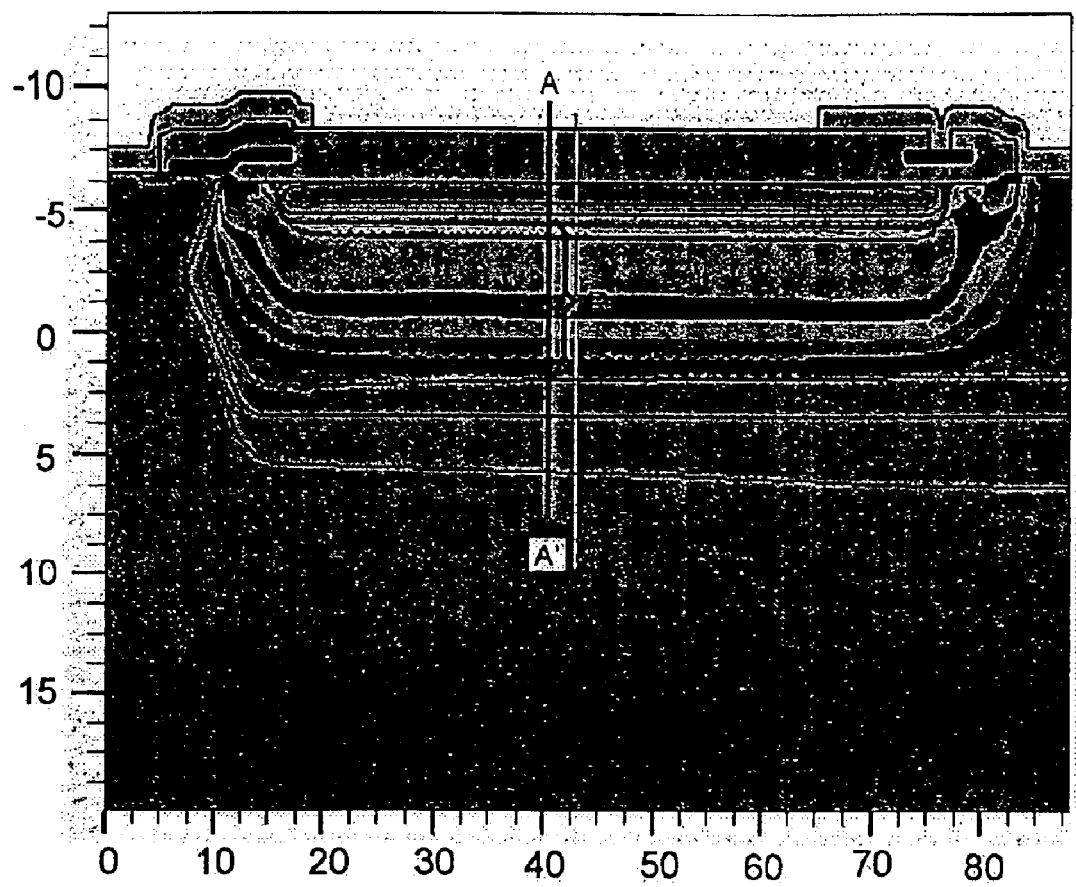
FIG. 8 illustrates the current density distribution of the LDMOS transistor of FIG. 1.
Figure 9:
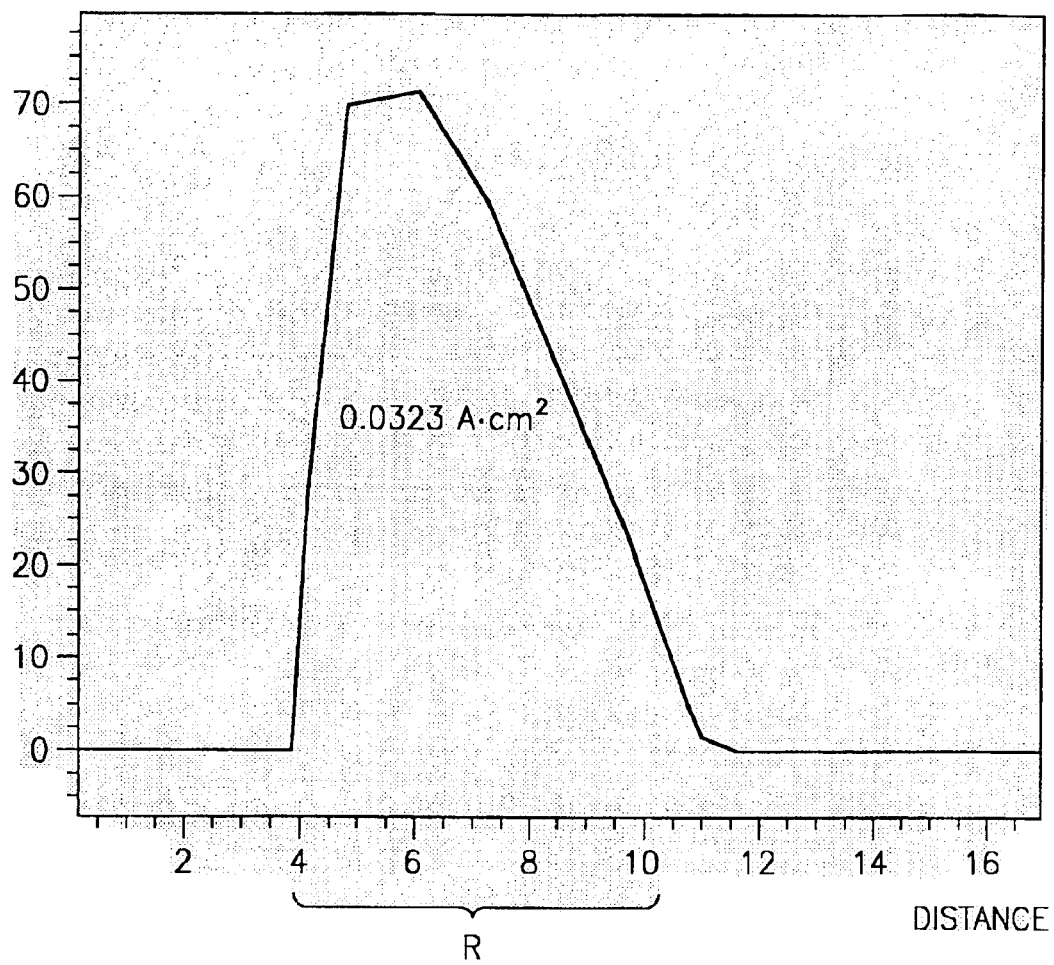
FIG. 9 is a graph of current density versus distance from the surface of the LDMOS transistor to a vertical position along line A-A' of FIG. 8.
Figure 10:
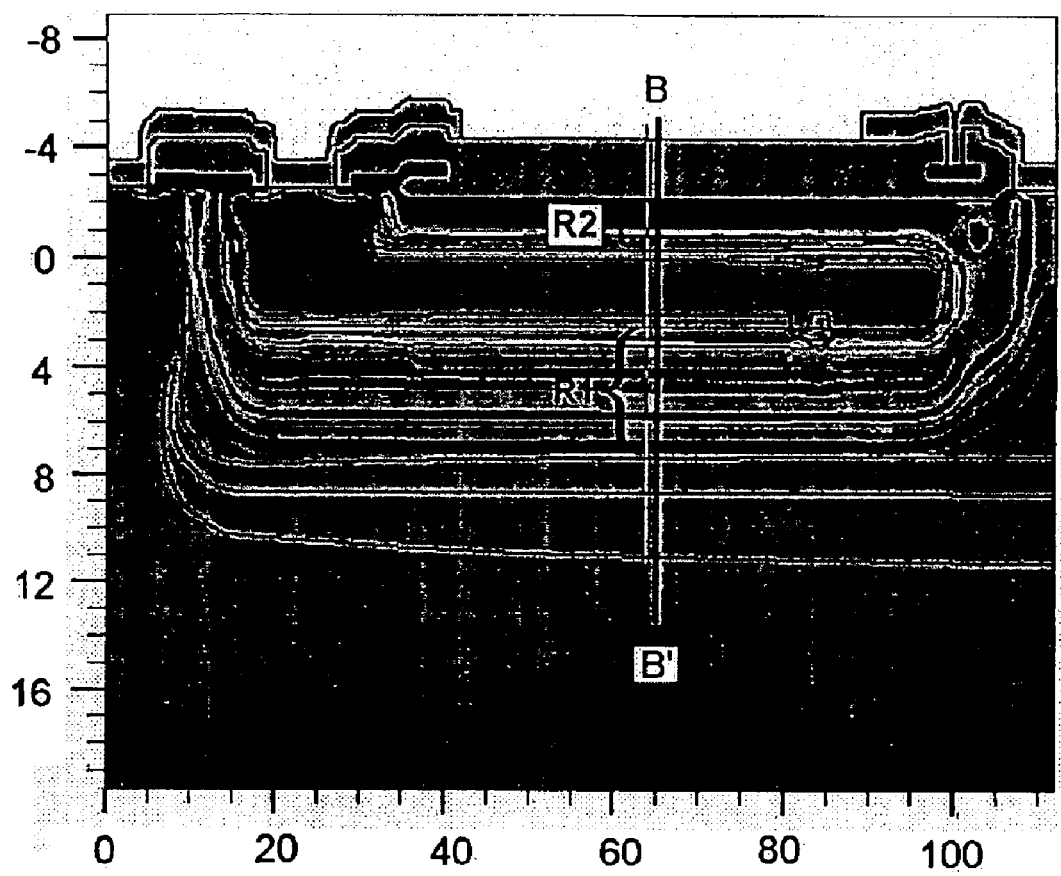
FIG. 10 illustrates the current density distribution of the LDMOS transistor of FIG. 2.
Figure 11:
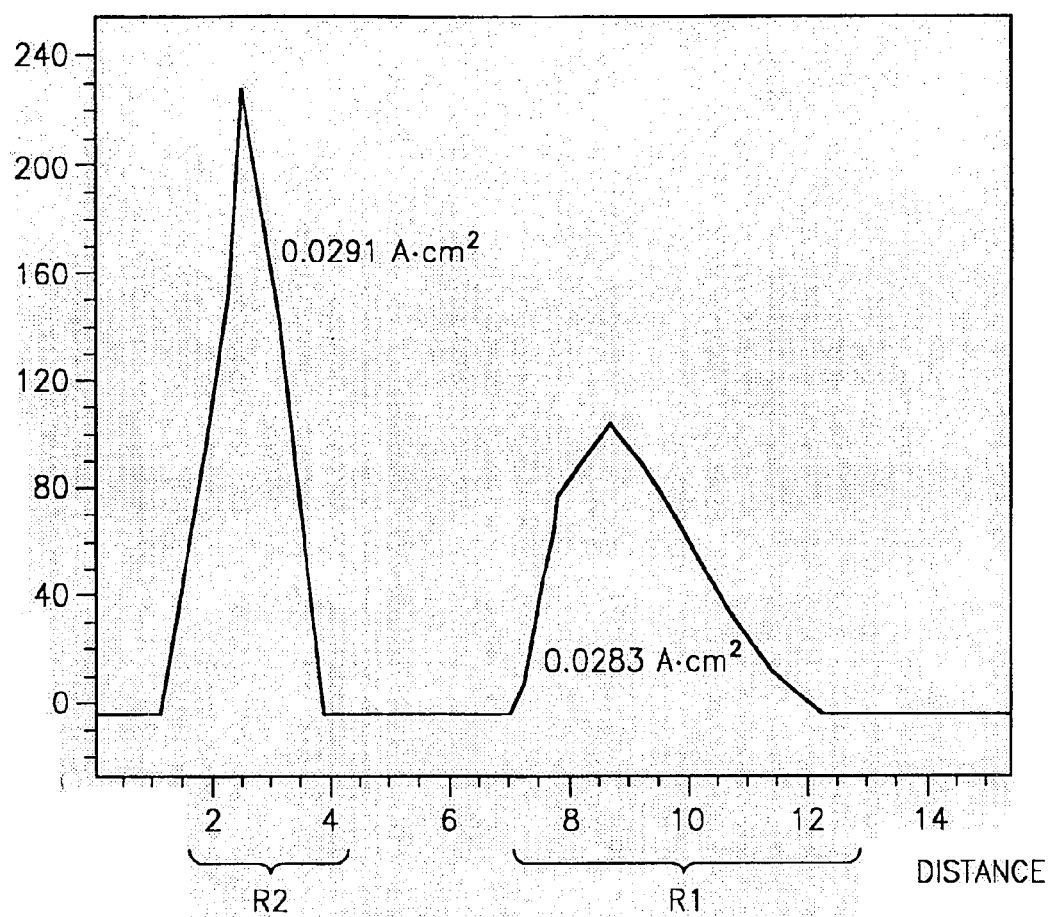
FIG. 11 is a graph of current density versus distance from the surface of the LDMOS transistor to a vertical position along line B–B' of FIG. 10.

FIGS. 8 and 10 illustrate the current density distribution of the LDMOS transistor of FIG. 1 and the current density distribution of the LDMOS transistor of FIG. 2, respectively. FIG. 9 is a graph of current density versus distance from the surface of the LDMOS transistor to a vertical position along line A–A' of FIG. 8, and FIG. 11 is a graph of current density versus distance from the surface of the LDMOS transistor to a vertical position along line B–B' of FIG. 10.

First, as shown in FIGS. 8 and 9, in the case of the LDMOS transistor of FIG. 1, current density is large only in a predetermined section R. This is because there is only one current path composed of the channel region 118 and the n$^-$-type epitaxial layer 104 under the p-type field shaping layer 116. Thus, the current density in the section is large. An integral value with respect to the current density curve means an overall current amount contained in the section, and as an experimental result, the overall current amount is shown by about 0.0323 A·cm$^2$. On the contrary, as shown in FIGS. 10 and 11, in the case of the LDMOS transistor of FIG. 2, there are two sections R1 and R2 of which current density is large. This is a natural result for a structure having two current paths, such as the first current path R1 and the second current path R2. As an experimental result, the overall current amount flowing through the first current path R1 is shown by about 0.0283 A·cm$^2$, and the overall current amount flowing through the second current path R2 is shown by about 0.0291 A·cm$^2$. Thus, the overall current amount is the sum of current amount flowing through each current path and is shown by about 0.0570 A·cm$^2$. This value indicates a current amount increase rate of about 78%, compared to the value of the LDMOS transistor of FIG. 1.

Figure 12:
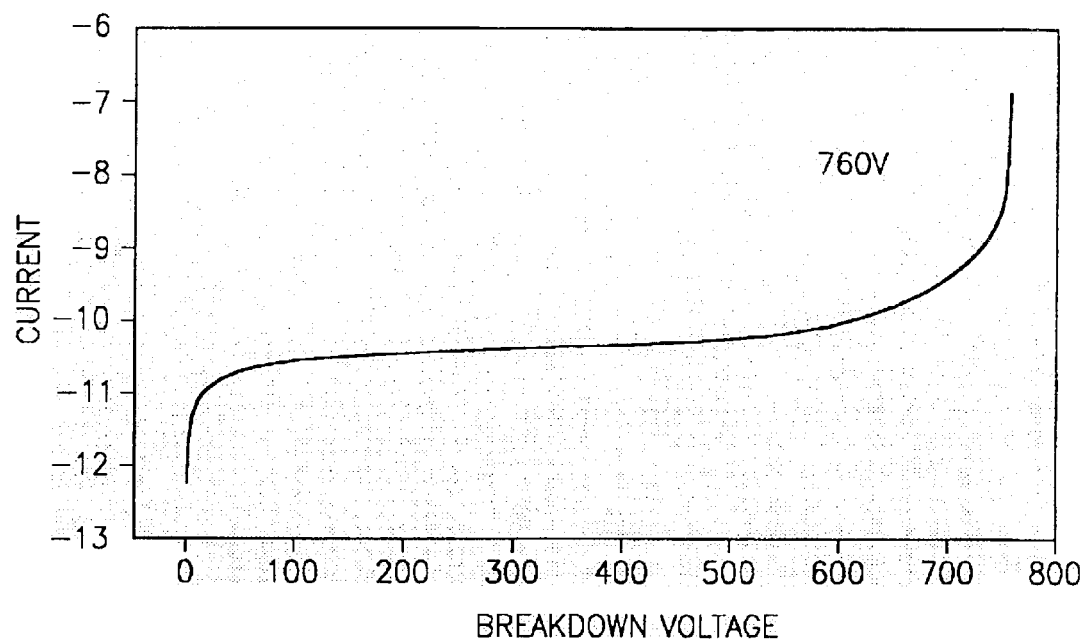
FIG. 12 is a graph of breakdown voltage for the LDMOS transistor of FIG. 1.
Figure 13:
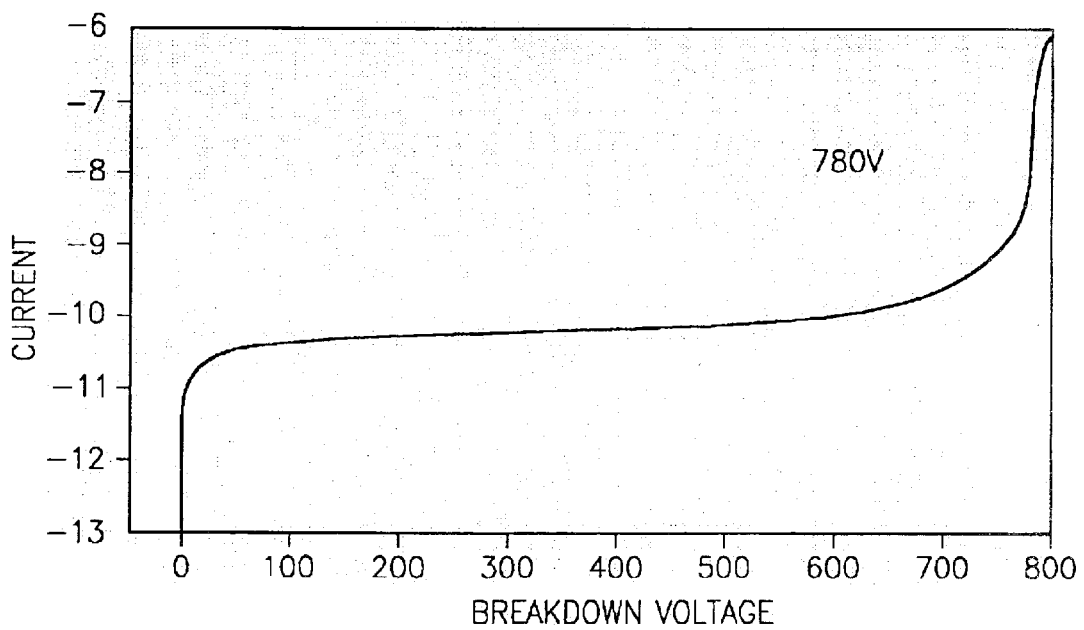
FIG. 13 is a graph of breakdown voltage for the LDMOS transistor of FIG. 2.

FIGS. 12 and 13 are graphs of breakdown voltage for the LDMOS transistor of FIGS. 1 and 2, respectively.

As shown in FIGS. 12 and 13, the breakdown voltage of the LDMOS transistor of FIG. 1 is about 760V, and the breakdown voltage of the LDMOS transistor of FIG. 2 is about 780V. Thus, in the case of the LDMOS transistor of FIG. 2, there is some effect of increasing a breakdown voltage.

Figure 14:
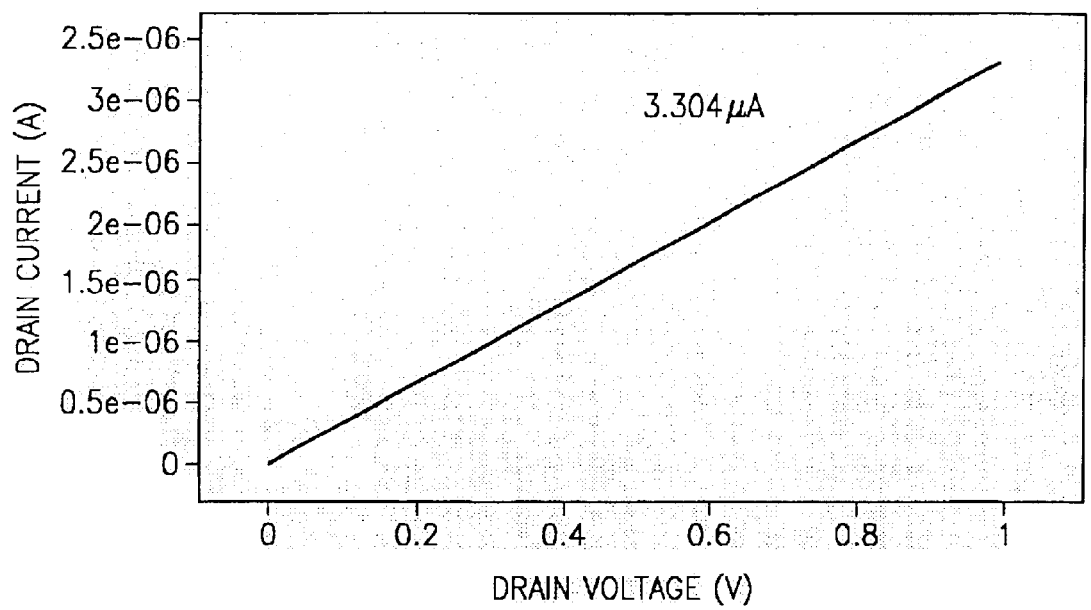
FIG. 14 is a graph of drain voltage versus drain current for the LDMOS transistor of FIG. 1.
Figure 15:
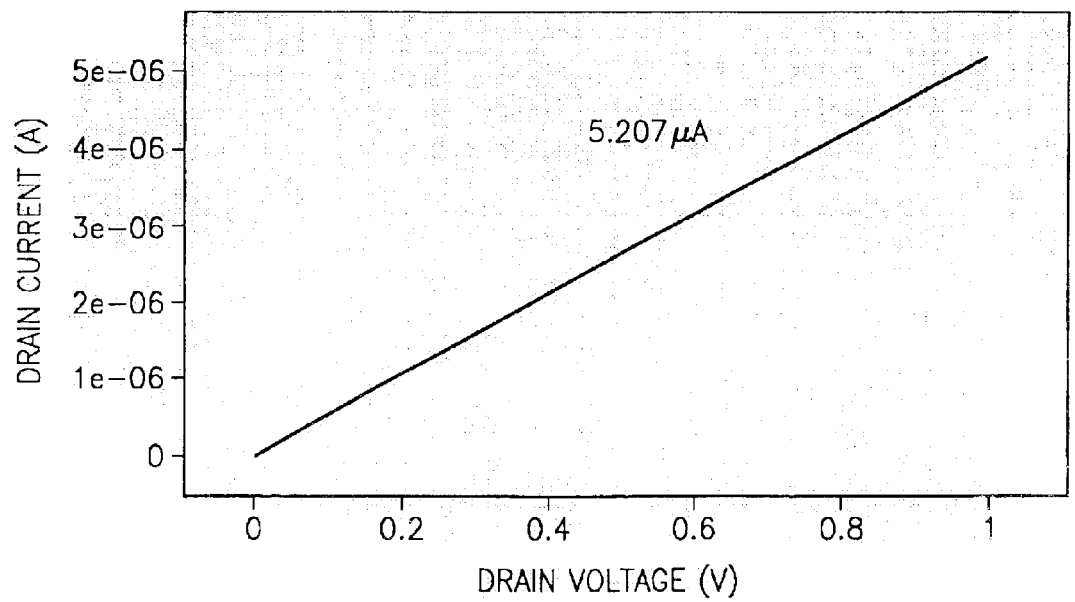
FIG. 15 is a graph of drain voltage versus drain current for the LDMOS transistor of FIG. 2.

FIGS. 14 and 15 are graphs of drain voltage versus drain current for the LDMOS transistor of FIGS. 1 and 2, respectively.

As shown in FIGS. 14 and 15, the drain current with respect to the drain voltage of the LDMOS transistor of FIG. 1 is about 3.304 $\mu$A, and the drain current with respect to the drain voltage of the LDMOS transistor of FIG. 2 is about 5.207 $\mu$A. Thus, the drain current with respect to the drain voltage of the LDMOS transistor is larger than the drain current with respect to the drain voltage of the LDMOS transistor of FIG. 1.

As described above, in the LDMOS transistor having multiple current paths according to the present invention, at least two sections of current paths are provided such that a current transport ability between a source region and a drain region is increased, a breakdown voltage is thereby maintained and simultaneously, an on-resistance of a device is reduced.

While this invention has been particularly shown and described with reference to a preferred embodiment thereof, it will be understood by those skilled in the art that various changes in form and details may be made therein without departing from the spirit and scope of the invention as defined by the appended claims and equivalents thereof.

What is claimed is:

1. A lateral double-diffused MOS (LDMOS) transistor comprising:
   a semiconductor substrate formed of a material having first conductivity type impurities;
   a drift region formed of a material having second conductivity type impurities on the semiconductor substrate;
   a first buried layer formed of a material having first conductivity type impurities and a second buried layer formed of a material having second conductivity type impurities, which are arranged at a boundary between the semiconductor substrate and the drift region;
   a first well region formed of a material having first conductivity type impurities to contact the first buried layer in a first portion of the drift region;
   a first source region formed of a material having second conductivity type impurities in a predetermined upper region of the first well region;
   a drain region formed of a material having second conductivity type impurities in a predetermined region of the drift region, the drain region being spaced a predetermined distance from the first well region;
   a third buried layer formed of a material having first conductivity type impurities in a second portion of the drift region, the third buried layer being overlapped with a part of an upper portion of the second buried layer;
   a second well region formed of a material having first conductivity type impurities in the second portion of the drift region, the second well region being overlapped with the third buried layer;
   a second source region formed of a material having second conductivity type impurities in a predetermined upper portion of the second well region;
   a gate insulating layer formed in a first channel region inside the first well region and in a second channel region inside the second well region;
   a gate electrode formed on the gate insulating layer;
   a source electrode formed to be electrically connected to the first source region and the second source region; and
   a drain electrode formed to be electrically connected to the drain region.

2. The LDMOS transistor of claim 1, wherein the impurity concentration of the first buried layer and the third buried layer is higher than the impurity concentration of the first well region and the second well region.

3. The LDMOS transistor of claim 1, wherein the impurity concentration of the second buried layer is higher than the impurity concentration of the drift region.

4. The LDMOS transistor of claim 1, wherein the first channel region is a region between the first source region and the drift region in an upper portion of the first well region, and the second channel region is a region between the second source region and the drift region.

5. The LDMOS transistor of claim 1, wherein carriers from the first source region move to the drain region through a first current path that comprises the first channel region and the second buried layer.

6. The LDMOS transistor of claim 5, wherein the first current path goes through the second channel region, the second source region, and the drift region between the second well region and the drain region.

7. The LDMOS transistor of claim 5, wherein carriers from the second source region move to the drain region through a second current pathcomprising the second channel and the drift region.

8. The LDMOS transistor of claim 1, further comprising:
   a first source contact region, which is adjacent to the first source region in the first well region and is electrically connected to the source electrode; and
   a second source contact region, which is adjacent to the second source region in the second well region and is electrically connected to the source electrode.

9. The LDMOS transistor of claim 1, wherein the first conductivity type impurities are p-type, and the second conductivity type impurities are n-type.

* * * * *